(12) United States Patent
St. Rock et al.

(10) Patent No.: US 8,653,358 B2
(45) Date of Patent: Feb. 18, 2014

(54) THERMOELECTRIC DEVICE ARCHITECTURE

(75) Inventors: Brian St. Rock, Andover, CT (US);
Scott F. Kaslusky, West Hartford, CT (US)

(73) Assignee: Hamilton Sunstrand Corporation, Windsor Locks, CT (US)

( * ) Notice: Subject to any disclaimer, the term of this patent is extended or adjusted under 35 U.S.C. 154(b) by 567 days.

(21) Appl. No.: 12/642,123

(22) Filed: Dec. 18, 2009

(65) Prior Publication Data
US 2011/0146740 A1 Jun. 23, 2011

(51) Int. Cl.
*H01L 35/00* (2006.01)
*H01L 35/30* (2006.01)

(52) U.S. Cl.
USPC .......................................... 136/211; 136/205

(58) Field of Classification Search
USPC ......... 136/136, 200, 201, 205, 206, 207, 208, 136/209, 210, 211, 230, 202, 228, 203, 212
See application file for complete search history.

(56) References Cited

U.S. PATENT DOCUMENTS

| | | | |
|---|---|---|---|
| 4,465,894 A | 8/1984 | Reyes | |
| 5,367,890 A * | 11/1994 | Doke | 62/3.7 |
| 5,610,366 A | 3/1997 | Fleurial et al. | |
| 6,162,985 A * | 12/2000 | Parise | 136/201 |
| 6,300,150 B1 | 10/2001 | Venkatasubramanian | |
| 6,411,109 B1 | 6/2002 | Hanson | |
| 6,705,089 B2 | 3/2004 | Chu et al. | |
| 6,739,138 B2 | 5/2004 | Saunders et al. | |
| 2001/0052357 A1 | 12/2001 | Kajihara et al. | |
| 2003/0140957 A1 * | 7/2003 | Akiba | 136/224 |
| 2005/0115601 A1 * | 6/2005 | Olsen et al. | 136/212 |
| 2006/0021648 A1 | 2/2006 | Parise | |
| 2006/0048809 A1 | 3/2006 | Onvural | |
| 2006/0102223 A1 | 5/2006 | Chen et al. | |
| 2006/0185710 A1 | 8/2006 | Yang et al. | |
| 2007/0018038 A1 | 1/2007 | Jarmon et al. | |
| 2008/0083447 A1 | 4/2008 | Sienel | |

FOREIGN PATENT DOCUMENTS

AT 508277 A1 12/2010

OTHER PUBLICATIONS

Extended European Search Report for EP Application No. 10252150.7-1235, dated Sep. 19, 2012, pp. 1-6.

* cited by examiner

*Primary Examiner* — Alexander Kollias
(74) *Attorney, Agent, or Firm* — Cantor Colburn LLP

(57) ABSTRACT

A thermoelectric device (100, 220) includes a plurality of conductor portions (120-124) including a first angled side portion (134) and a second angled side portion (135). The thermoelectric device (100, 220) also includes a plurality of conductor members (170-174) including a first angled side section (181) and a second angled side section (182). A plurality of P-type thermoelectric members (210-213) interconnect corresponding ones of the first angled side portions (134) with the first angled side sections (181). A plurality of N-type thermoelectric members (200-204) interconnect corresponding ones of the second angled side portions (135) with the second angled side sections (182). Electric flow through the plurality of conductor portions (120-124) and the plurality of conductor members (170-174) passes along a first predefined curvilinear path and a heat flux passes along a second predefined curvilinear path.

15 Claims, 3 Drawing Sheets

THERMOELECTRIC DEVICE ARCHITECTURE

BACKGROUND OF THE INVENTION

The subject matter disclosed herein relates to thermoelectric devices and, more particularly, to an architectural configuration of a thermoelectric device.

Thermoelectric devices include thermoelectric coolers that operate according to the Peltier effect in which an electrical input is transformed to a heat flux, and thermoelectric generators that operate according to the Seebeck effect in which a heat flux is transformed to an electrical output. Thermoelectric heat pumps or coolers are solid-state devices that use the Peltier effect to create a heat flux between junctions of two different types of materials. Heat is transferred from one side of the device to another side of the device against a thermal gradient with the consumption of electrical energy. Conversely, thermoelectric generators are solid-state devices that convert a heat flux between first and second sides into electrical energy. Both thermoelectric coolers and thermoelectric generators operate at about 5-10% efficiency.

Conventional thermoelectric architecture includes a planar configuration, such as shown at 2 in FIG. 1 and a stacked configuration such as shown at 4 in FIG. 2. Planar configuration 2 includes a hot side 5 and a cold side 6. Hot side 5 includes a first insulator portion 7 having mounted thereto a plurality of conductors 8-12. Cold side 6 includes a second insulator portion 14 having a plurality of conductors 20-24. Conductors 8-12 and 20-24 are joined though a plurality of N-type material members 30-34, and P-type material members 40-43. Upon the application of an electrical current, a heat flux is generated that flows from hot side 5 to the cold side 6. With this arrangement, the heat flux passes along a substantially linear path from the hot side 5 to the cold side 6 while electrical flow through conductors 8-12 and 20-24 passes along a generally tortuous path. The generally tortuous path leads to losses that result in low operational efficiency.

Stacked configuration 4 includes a hot side 50 and a cold side 51. Hot side 50 includes a first insulator portion 54 having extending therethrough a plurality of conductors 56-60. Cold side 51 includes a second insulator portion 64 having extending therethrough a plurality of conductors 66-71. Cold side 51 is mounted to hot side 50 with conductors 56-60 being interleaved with conductors 66-71. In addition, conductors 56-60 and 66-71 are joined though a plurality of N-type material members 74-78, and P-type material members 80-84. Upon the application of an electrical current, a heat flux is generated that flows from hot side 50 to the cold side 51. With this arrangement, the heat flux passes along a substantially tortuous path from the hot side 50 to the cold side 51 while the electrical flow through conductors 56-60 and 66-71 passes along a generally linear path. In a manner similar to that described above, the generally tortuous path leads to losses that result in low operational efficiency.

BRIEF DESCRIPTION OF THE INVENTION

According to one aspect of the invention, a thermoelectric device includes a plurality of conductor portions including a base portion a first angled side portion, and a second angled side portion. The first angled side portion is coupled to the second angled side portion. The thermoelectric device also includes a plurality of conductor members including a base section, a first angled side section and a second angled side section. The first angled side section is coupled to the second angled side section. A plurality of P-type thermoelectric members interconnect corresponding ones of the first angled side portions with the first angled side sections. Each of the plurality of P-type thermoelectric members is angled relative to a longitudinal axis and an axis that extends perpendicular to the longitudinal axis. A plurality of N-type thermoelectric members interconnect corresponding ones of the second angled side portions with the second angled side sections. Each of the plurality of N-type thermoelectric members is angled relative to the longitudinal axis and the axis that extends perpendicular to the longitudinal axis. Electric flow through the plurality of conductor portions and conductor members passes along a first predefined curvilinear path and a heat flux passes along a second predefined curvilinear path.

According to another aspect of the invention, a method of operating a thermoelectric device includes passing a heat flux from a first side of the thermoelectric device (100) to a second side of the thermoelectric device (100). The heat flux flows along a curvilinear path defined by at least one of a N-type thermoelectric member and a P-type thermoelectric member. The one of the N-type thermoelectric member and P-type thermoelectric member is at an angle relative to a longitudinal axis and an axis that extends perpendicular to the longitudinal axis. The method also includes guiding an electrical current through a plurality of conductor portions mounted relative to the first side and a plurality of conductor members mounted relative to the second side of the thermoelectric device. The electrical current flows along a curvilinear path defined by side portions of the plurality of conductor portions and side sections of the plurality of conductor members. The side portions and the side sections being at an angle relative to the longitudinal axis and the axis that extends perpendicular to the longitudinal axis.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
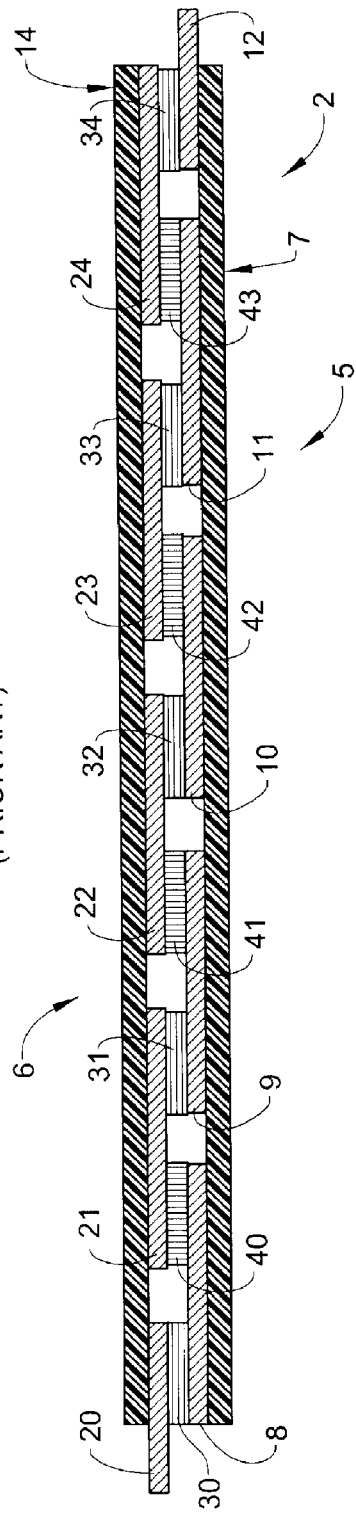
FIG. 1 is a schematic view of a thermoelectric device in accordance with the prior art showing a Stonehenge configuration.
Figure 2:
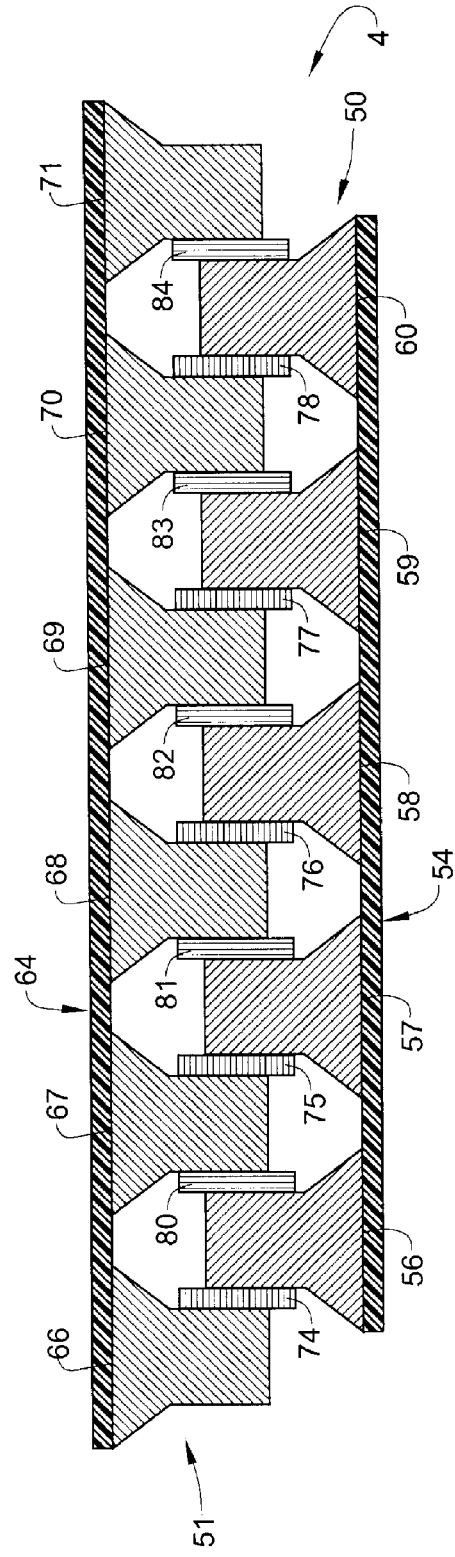
FIG. 2 is a schematic view of a thermoelectric device in accordance with the prior art showing a stacked configuration.
Figure 3:
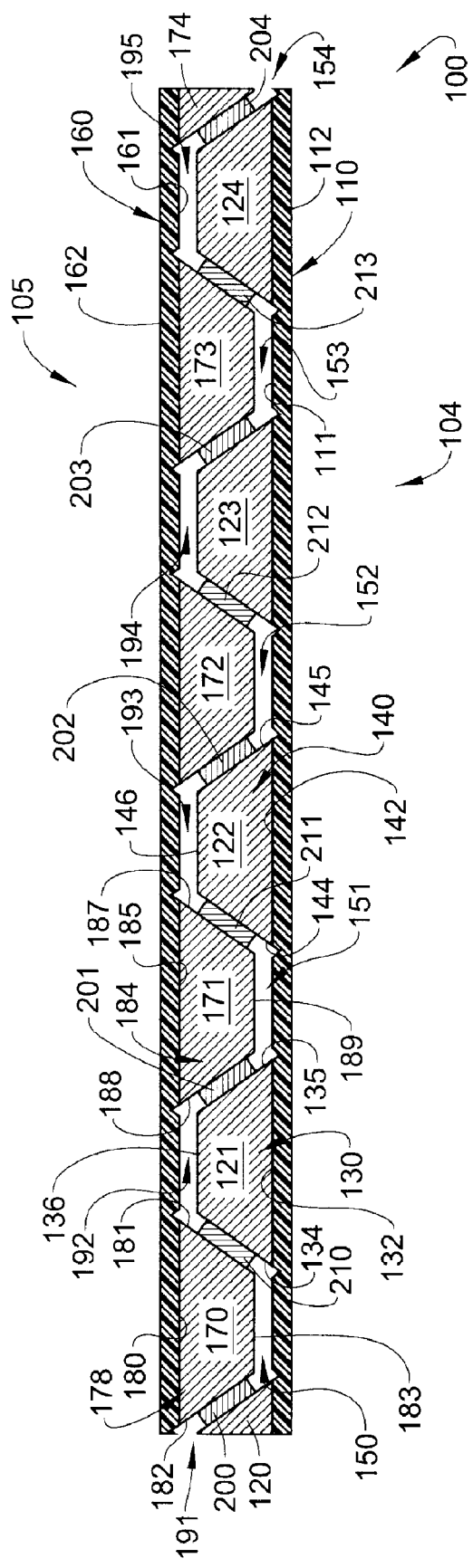
FIG. 3 is a schematic view of a single stage thermoelectric device in accordance with an exemplary embodiment.

With reference to FIG. 3, a thermoelectric (TE) device constructed in accordance with an exemplary embodiment is indicated generally at 100. TE device 100 includes a hot side 104 and a cold side 105. Hot side 104 includes an electrically insulating header or insulator layer 110 having a first surface 111 and an opposing, second surface 112. A plurality of conductor leads or portions 120-124 are mounted to insulator layer 110. In the exemplary embodiment shown, conductor portion 121 includes a body portion 130 including a base portion 132 that is mounted to first surface 111. Conductor portion 121 further includes a first angled side portion 134 and a second angled side portion 135. First and second angled side portions 134 and 135 extend from base portion 132 and are joined by a third side portion 136. First and second angled side portions 134 and 135 are arranged at an angle relative to a longitudinal axis defined by insulator layer 110, and relative to an axis that extends perpendicularly to the longitudinal axis, while third side portion 136 is substantially parallel to base portion 132 and first surface 111.

Similarly, conductor portion 122 includes a body portion 140 including a base portion 142 that is mounted to first surface 111. Conductor portion 122 further includes a first angled side portion 144 and a second angled side portion 145. First and second angled side portions 144 and 145 extend from base portion 140 and are joined by a third side portion 146. First and second angled side portions 144 and 145 are arranged at an angle relative to the longitudinal axis defined by insulator layer 110, and relative to an axis that extends perpendicularly to the longitudinal axis, while third side portion 146 is substantially parallel to base portion 140 and first surface 111. At this point it should be understood that the remaining conductor portions 120 and 123-124 include similar structure. Also, as shown, each conductor portion 120-124 is spaced one from the other thereby forming a plurality of void regions 150-154.

Cold side 105 includes an insulator layer 160 having a first surface 161 and an opposing, second surface 162. A plurality of conductor members 170-174 are mounted to insulator layer 160. In the exemplary embodiment shown, conductor member 170 includes a body section 178 including a base section 180 that is mounted to first surface 161. Conductor member 170 further includes a first angled side section 181 and a second angled side section 182. First and second angled side sections 181 and 182 extend from base section 180 and are joined by a third side section 183. First and second angled side sections 181 and 182 are arranged at an angle relative to a longitudinal axis defined by insulator layer 160, and relative to an axis that extends perpendicularly to the longitudinal axis, while third side section 183 is substantially parallel to base portion 180 and first surface 161.

Similarly, conductor member 171 includes a body section 184 having a base section 185 that is mounted to first surface 161. Conductor member 171 further includes a first angled side section 187 and a second angled side section 188. First and second angled side sections 187 and 188 extend from base section 185 and are joined by a third side section 189. First and second angled side sections 187 and 188 are arranged at an angle relative to the longitudinal axis defined by insulator layer 160, and relative to an axis that extends perpendicularly to the longitudinal axis, while third side section 189 is substantially parallel to base section 185 and first surface 161. At this point it should be understood that the remaining conductor members 172-174 include similar structure. Also, as shown, each conductor member 170-174 is spaced one from the other thereby forming a plurality of void regions 191-195.

In accordance with the exemplary embodiment shown, hot side 104 is joined to cold side 105 through a plurality of N-type thermoelectric dies or members 200-204 and P-type thermoelectric dies or members 210-213. More specifically, cold side 105 is arranged relative to hot side 104 such that conductor portions 120-124 extend into respective ones of void regions 191-195 while remaining spaced from first surface 161 and conductor members 170-174 extend into respective ones of void regions 150-154 while remaining spaced from first surface 111. In this manner, P-type thermoelectric member 210 joins first angled side portion 134 with first angled side section 181, P-type thermoelectric member 211 joins first angled side portion 144 with first angled side section 187, and the remaining P-type thermoelectric members 212, 213 join the first angled side portions of conductor portions 123 and 124 with the first angled side sections of conductor members 172 and 173. Similarly, N-type thermoelectric member 200 joins the second angled side portion (not separately labeled) of conductor portion 120 with second angled side section 182 of conductor member 170, N-type thermoelectric member 201 joins second angled side portion 144 with second angled side section 187, and the remaining N-type thermoelectric members 202-204 join the second angled side portions of conductor portions 122-124 with the second angled side sections of conductor members 172-174.

In this manner, the plurality of N-type thermoelectric members 200-204 and plurality of P-type thermoelectric members 210-213 are angled relative to a longitudinal axis defined by insulator layers 110 and 160 and relative to an axis that extends perpendicularly to the longitudinal axis. With this arrangement, an electrical current passing through conductor portions 120-124 and conductor members 170-174 flows in a curvilinear path defined by the respective angled side portions and angled side sections and a heat flux generated by the electrical current flows from hot side 104 to cold side 105 along a curvilinear path defined by the angles of the N-type members and P-type thermoelectric members. The shape of the curvilinear path of the electrical current and the curvilinear path of the heat flux can be adjusted by altering the magnitude of the angled side portions and angled side sections. By adjusting the curvilinear path of the electrical current and the curvilinear path of the heat flux, electrical and thermal efficiency of TE device 100 is enhanced.

Figure 4:
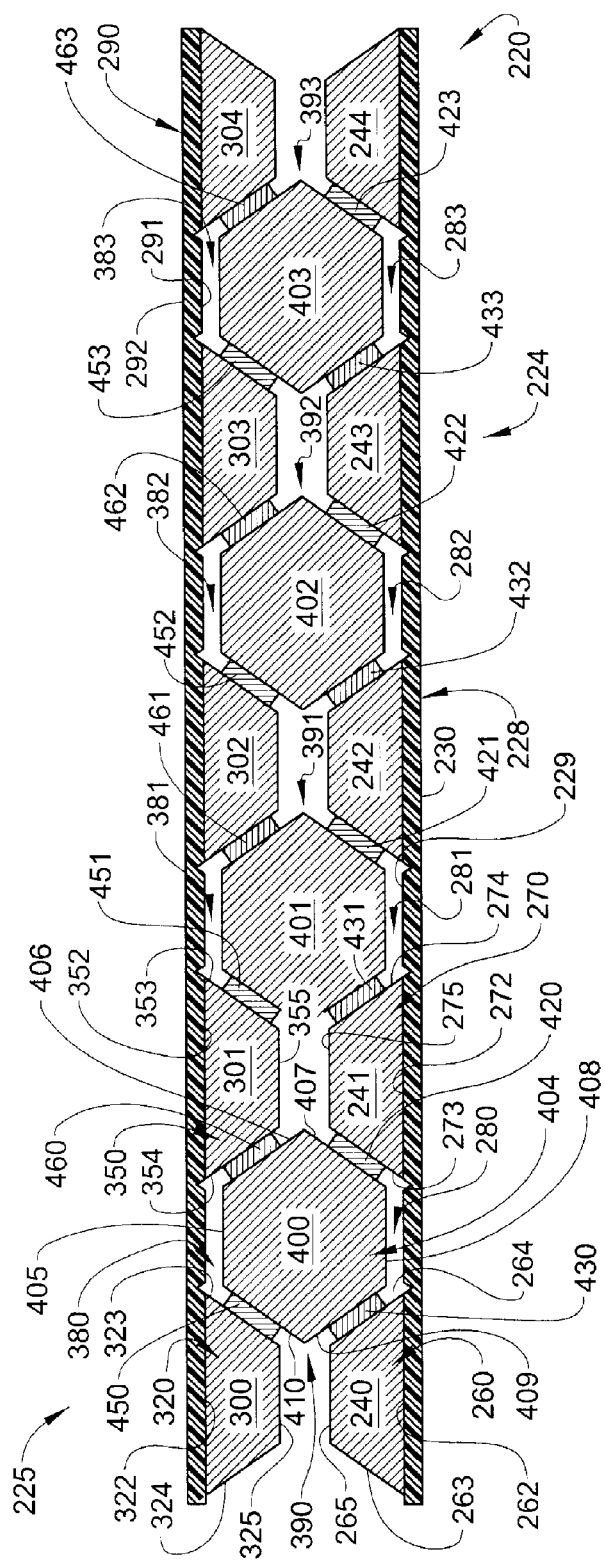
FIG. 4 is a schematic view of a two stage thermoelectric device in accordance with an exemplary embodiment.

With reference to FIG. 4, a two-stage thermoelectric (TE) device, constructed in accordance with an exemplary embodiment, is indicated generally at 220. TE device 220 includes a hot side 224 and a cold side 225. Hot side 224 includes an insulator layer 228 having a first surface 229 and an opposing, second surface 230. A plurality of conductor portions 240-244 are mounted to insulator layer 228. In the exemplary embodiment shown, conductor portion 240 includes a body portion 260 including a base portion 262 that is mounted to first surface 229. Conductor portion 240 further includes a first angled side portion 263 and a second angled side portion 264. First and second angled side portion 263 and 264 extend from base portion 262 and are joined by a third side portion 265. First and second angled side portions 263 and 264 are arranged at an angle relative to a longitudinal axis defined by insulator layer 228, and relative to an axis that extends perpendicularly to the longitudinal axis, while third side portion 265 is substantially parallel to base portion 262 and first surface 229.

Similarly, conductor portion 241 includes a body portion 270 including a base portion 272 that is mounted to first surface 229. Conductor portion 241 further includes a first angled side portion 273 and a second angled side portion 274. First and second angled side portions 273 and 274 extend from base portion 272 and are joined by a third side portion 275. First and second angled side portions 273 and 274 are arranged at an angle relative to the longitudinal axis defined by insulator layer 228 and relative to an axis that extends perpendicularly to the longitudinal axis, while third side portion 275 is substantially parallel to base portion 272 and first surface 229. At this point it should be understood that the remaining conductor portions 242-244 include similar structure. Also, as shown, each conductor portion 240-244 is spaced one from the other thereby forming a plurality of void regions 280-283.

Cold side 225 includes an insulator layer 290 having a first surface 291 and an opposing, second surface 292. A plurality of conductor members 300-304 are mounted to insulator layer 290. In the exemplary embodiment shown, conductor member 300 includes a body section 320 including a base section 322 that is mounted to first surface 291. Conductor member 300 further includes a first angled side section 323 and a second angled side section 324. First and second angled side sections 323 and 324 extend from base section 322 and are joined by a third side section 325. First and second angled side sections 323 and 324 are arranged at an angle relative to a longitudinal axis defined by insulator layer 290, and relative to an axis that extends perpendicularly to the longitudinal axis, while third side section 325 is substantially parallel to base portion 322 and first surface 291.

Similarly, conductor member 301 includes a body section 350 having a base section 352 that is mounted to first surface 291. Conductor member 301 further includes a first angled side section 353 and a second angled side section 354. First and second angled side sections 353 and 354 extend from base section 352 and are joined by a third side section 355. First and second angled side sections 353 and 354 are arranged at an angle relative to the longitudinal axis defined by insulator layer 290 and relative to an axis that extends perpendicularly to the longitudinal axis, while third side section 355 is substantially parallel to base section 352 and first surface 291. At this point it should be understood that the remaining conductor members 302-304 include similar structure. Also, as shown, each conductor member 300-304 is spaced one from the other thereby forming a plurality of void regions 380-383.

In accordance with the exemplary embodiment shown, cold side 225 is arranged relative to hot side 224 such that conductor members 300-303 face conductor portions 240-244 with regions 280-284 aligning with void regions 380-383 forming corresponding void zones 390-393. A plurality intermediate conductor members 400-403 are arranged in respective ones of void zones 390-393. As each intermediate conductor member 400-403 is similarly formed, a detailed description will follow referencing intermediate conductor member 400 with an understanding that the remaining intermediate conductor members 401-403 include corresponding structure.

Intermediate conductor member 400 includes a body portion 404 having a plurality of angled side elements 405-410. A first plurality of P-type thermoelectric members 420-423, and a first plurality of N-type thermoelectric members 430-433 link conductor portions 240-244 to intermediate conductor members 400-403. For example, P-type thermoelectric member 420 joins first angled side portion 273 with angled side element 407 of intermediate conductor member 400, and N-type thermoelectric member 430 joins second angled side portion 264 with angled side element 409 of intermediate conductor member 400.

Similarly, a first plurality of P-type thermoelectric members 450-453, and a first plurality of N-type thermoelectric members 460-463 link conductor members 300-304 to intermediate conductor members 400-403. For example, P-type thermoelectric member 450 joins first angled side section 323 with angled side element 410 of intermediate conductor member 400, and N-type thermoelectric member 460 joins second angled side section 354 with angled side element 406 of intermediate conductor member 400. In this manner, the first and second pluralities of P-type members 420-423 and 450-453 and the first and second pluralities of N-type thermoelectric members 430-433, and 460-463 are angled relative to a longitudinal axis defined by insulator layers 228 and 290 and relative to an axis that extends perpendicularly to the longitudinal axis. With this arrangement, an electrical current passing through conductor portions 240-244, intermediate conductor members 400-404 and conductor members 300-304 flows in a curvilinear path defined by the respective angled side portions, angled side elements, and angled side sections, and a heat flux generated by the electrical current flows from hot side 224 to cold side 225 along a curvilinear path defined by the angles of the N-type members and P-type members. The shape of the curvilinear path of the electrical current and curvilinear path of the heat flux can be adjusted by altering the magnitude of the angled side portions, angled side elements, and angled side sections. By adjusting the curvilinear paths of the electrical current and curvilinear path of the heat flux, electrical and thermal efficiency of TE device 220 is enhanced.

Figure 5:
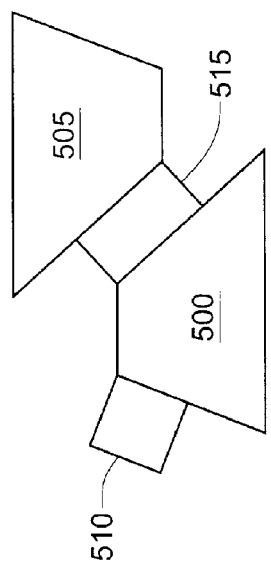
FIG. 5 is a partial schematic view of a two stage thermoelectric device in accordance with another aspect of an exemplary embodiment.

At this point it should be understood that the exemplary embodiments form a thermoelectric (TE) device having fewer stress concentrations than existing TE devices. The angled surfaces eliminate regions of high shear stress at an interface between TE members and conductor portions. The existing planar devices are subjected to interfacial shear created by transverse loading. Stacked devices, on the other hand, are subjected to transverse shear by compressive loading. The angled architecture employed in connection with the exemplary embodiments distributes forces throughout the TE device thereby eliminating regions of pure shear at the interface regions. In addition to eliminating shear forces, the angled architecture reduces an overall weight of the TE device by eliminating material necessary in the planar and stacked configurations. Finally, the angled architecture enables the use of different size P-type thermoelectric and N-Type thermoelectric members. That is, as shown by altering the degree of each angled side portions of conductor portion 500 and conductor portion 505, or the angled side sections of the conductor members, P-type thermoelectric member 510 can be formed having a first size/shape and N-type thermoelectric member 515 can be formed having a second size/shape that is distinct from the first size/shape such as shown in FIG. 5. In this manner, the flexibility, i.e., the ability to tailor the TE device to specific application is further enhanced.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:
1. A thermoelectric device comprising:
a plurality of conductor portions in the form of a trapezoid including a base portion, a first angled side portion, and a second angled side portion, wherein the second angled side portion is arranged opposite the first angled side portion and coupled to the first angled side portion through the base portion;

a plurality of conductor members in the form of a trapezoid including a base section, a first angled side section, and a second angled side section, wherein the second angled side section is arranged opposite to the first angled side section and coupled to the first angled side section through the base section;

a plurality of P-type thermoelectric members interconnecting corresponding ones of the first angled side portions with the first angled side sections, each of the plurality of P-type thermoelectric members being angled relative to a longitudinal axis and an axis that extends perpendicular to the longitudinal axis; and a plurality of N-type thermoelectric members interconnecting corresponding ones of the second angled side portions with the second angled side sections, each of the plurality of N-type thermoelectric members being angled relative to the longitudinal axis and the axis that extends perpendicular to the longitudinal axis, wherein electric flow through the plurality of conductor portions and the plurality of conductor members passes along a first predefined curvilinear path and a heat flux passes along a second predefined curvilinear path.

2. The thermoelectric device according to claim 1, wherein the plurality of conductor portions include a third side portion joining the first and second angled side portions, and the plurality of conductor members include a third side section joining the first and second angled side sections.

3. The thermoelectric device according to claim 1, wherein the first angled side portion includes a first angle portion and the second angled side portion includes a second angle portion, the first angle portion being distinct from the second angle portion, and wherein the first angled side section includes a first angle section and the second angled side section includes a second angle section, the first angle section being distinct from the second angle section.

4. The thermoelectric device according to claim 3, wherein at least one of the plurality of P-type thermoelectric members includes at least one of a first size and shape and at least one of the plurality of N-type thermoelectric members includes at least one of a second size and shape, the at least one of the first size and shape being distinct from the at least one of the second size and shape.

5. The thermoelectric device according to claim 1, further comprising: a first insulating layer including a first surface and a second surface, and a second insulating layer including a first surface and a second surface, wherein the plurality of conductor portions are mounted to the first surface of the first insulating layer and the plurality of conductor members are mounted to the first surface of the second insulating layer.

6. The thermoelectric device according to claim 5, wherein each of the plurality of conductor portions are spaced, one from the other, forming a first plurality of void regions, and each of the plurality of conductor members are spaced, one from the other, forming a second plurality of void regions.

7. The thermoelectric device according to claim 6, wherein each of the plurality of conductor portions extend into respective ones of the second plurality of void regions and each of the plurality of conductor members extend into respective ones of the first plurality of void regions.

8. The thermoelectric device according to claim 6, wherein each of the plurality of conductor portions is spaced from the first surface of the second insulating layer.

9. The thermoelectric device according to claim 6, wherein each of the plurality of conductor members is spaced from the first surface of the first insulating layer.

10. The thermoelectric device according to claim 6, wherein each of the plurality of conductor portions is aligned with respective ones of each of the plurality of conducting members with the first plurality of void regions combining with the second plurality of void regions to form a plurality of void zones.

11. The thermoelectric device according to claim 10, wherein each of the plurality of conducting portions is spaced from respective ones of the plurality of conducting members.

12. The thermoelectric device according to claim 10, further comprising: a plurality of intermediate conductor members, each of the plurality of intermediate conductor members being arranged in respective ones of the plurality of void zones.

13. The thermoelectric device according to claim 12, wherein each of the plurality of intermediate conductor members includes a plurality of angled side elements.

14. The thermoelectric device according to claim 13, wherein the plurality of P-type members includes a first plurality of P-type thermoelectric members that join respective ones of the first angled side portions with an angled side element of corresponding ones of the plurality of intermediate conductor members and a second plurality of P-type thermoelectric members that join another of the angled side elements of corresponding ones of the plurality of intermediate conductor members with respective ones of the first angled side section.

15. The thermoelectric device according to claim 13, wherein the plurality of N-type thermoelectric members includes a first plurality of N-type thermoelectric members that join respective ones of the second angled side portions with an angled side element of corresponding ones of the plurality of intermediate conductor members and a second plurality of N-type thermoelectric members that join another of the angled side elements the of corresponding ones of the plurality of intermediate conductor members with respective ones of the second angled side sections.

* * * * *